(12) United States Patent  
Ha et al.

(10) Patent No.: US 8,835,968 B2  
(45) Date of Patent: Sep. 16, 2014

(54) LED LENS AND LED PACKAGE USING THE SAME

(71) Applicant: Samsung Electronics Co., Ltd., Suwon-si (KR)

(72) Inventors: Sang Woo Ha, Gyeonggi-do (KR); Chin Woo Kim, Gyeonggi-do (KR); Jin Ha Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/937,865

(22) Filed: Jul. 9, 2013

(65) Prior Publication Data

US 2014/0117391 A1    May 1, 2014

(30) Foreign Application Priority Data

Oct. 29, 2012    (KR) .................. 10-2012-0120764

(51) Int. Cl.
 *H01L 33/00* (2010.01)
 *G02B 13/18* (2006.01)
(52) U.S. Cl.
 USPC ............... 257/98; 257/E33.073; 359/718
(58) Field of Classification Search
 USPC ........ 257/98, E33.073; 359/718; 362/296.01; 438/27
 See application file for complete search history.

(56) References Cited

U.S. PATENT DOCUMENTS 7,985,015 B2    7/2011    Tasch et al.

FOREIGN PATENT DOCUMENTS

| KR | 10-0942138 B1 | 2/2010 | |
| KR | 10-2010-0068313 A | 6/2010 | |
| KR | 1020100068313 A * | 6/2010 | ............... G02B 3/00 |
| KR | 10-2011-0138866 A | 12/2011 | |

* cited by examiner

*Primary Examiner* — Daniel Shook  
(74) *Attorney, Agent, or Firm* — McDermott Will & Emery LLP

(57) ABSTRACT

An LED lens includes a recess disposed in a quadrangular bottom surface of the LED lens and configured to have a light source disposed therein, wherein an internal surface of the recess, including lateral surfaces and top surfaces, is a light incident surface. The LED lens further includes a top surface forming a light exit surface, having a size greater than that of the bottom surface, and having a quadrangular shape; and lateral surfaces of the LED lens, disposed between the top and bottom surfaces of the LED lens, forming a reflective surface, and guiding light incident to the LED lens through the light incident surface to the light exit surface. The top surfaces of the light incident surface form an inverted quadrangular pyramid.

19 Claims, 5 Drawing Sheets

LED LENS AND LED PACKAGE USING THE SAME

CROSS-REFERENCE TO RELATED APPLICATION

This application claims the priority of Korean Patent Application No. 10-2012-0120764 filed on Oct. 29, 2012, in the Korean Intellectual Property Office, the disclosure of which is incorporated herein by reference.

TECHNICAL FIELD

The present disclosure relates to a light emitting diode (LED) lens and an LED package using the same.

BACKGROUND

A semiconductor light emitting device, such as a light emitting diode (LED), is a device including a material that emits light. Light is emitted through the application of electrical energy to the semiconductor light emitting device to cause energy generated by electron-hole recombination in semiconductor junction parts to be converted into light emitted from the device. LEDs are commonly employed as light sources in general illumination devices, display devices, and the like, and the development of LEDs has recently proceed at a rapid pace.

In particular, the speed of development of and range of uses for light emitting diodes (LEDs) (e.g., gallium nitride-based semiconductor light-emitting devices) have recently increased. LEDs are commonly used in camera flashes, mobile device keypads, vehicle turn signal lamps, and the like that have been commercialized The development of general illumination devices using LEDs has similarly proceed at an accelerated pace.

With the popularization of digital cameras, small-sized digital cameras are commonly embedded in mobile communications terminals such as mobile phones. Such digital cameras and cameras for mobile communications terminals are commonly provided with a built-in LED-based flash for providing light required in the case of night photographing.

As the range of uses of LEDs now extends to camera flashes, a method is needed for allowing light to be emitted from LEDs at an orientation angle and an angle of view appropriate for photography.

SUMMARY

An aspect of the present disclosure provides a light emitting diode (LED) lens capable of improving an orientation angle and an angle of view of light emitted therefrom.

An aspect of the present disclosure also provides an LED package capable of improving an orientation angle and an angle of view of light emitted therefrom.

According to an aspect of the present disclosure, there is provided an LED lens including: a recess disposed in a quadrangular bottom surface of the LED lens and configured to have a light source disposed therein, wherein an internal surface of the recess, including lateral surfaces and top surfaces of the recess, is a light incident surface; a top surface of the LED lens forming a light exit surface, having a size greater than a size of the bottom surface of the LED lens, and having a quadrangular shape; and lateral surfaces of the LED lens, disposed between the top surface of the LED lens and the bottom surface of the LED lens, forming a reflective surface, and guiding light incident to the LED lens through the light incident surface to the light exit surface, wherein the top surfaces of the light incident surface form an inverted quadrangular pyramid.

The quadrangular pyramid may include four lateral surfaces that are isosceles triangles.

Lateral surfaces on opposing sides of the quadrangular pyramid are isosceles triangles having the same shape.

The four lateral surfaces of the quadrangular pyramid may be isosceles triangles having the same shape.

A base of the quadrangular pyramid may be a rectangle, and a ratio of a length of one side of the rectangle to a length of another side adjacent to the one side may be 4:3, 3:2 or 16:9.

The light exit surface may be a planar surface.

The reflective surface may be a curved surface allowing light incident through the light incident surface to be reflected on the reflective surface and focused on the light exit surface.

The reflective surface may reflect the light incident through the light incident surface so as to be totally internally reflected.

A base of the quadrangular pyramid may be a rectangle, the rectangle having a same ratio between lengths of adjacent sides of the rectangle as a ratio between lengths of adjacent sides of the light exit surface.

Each side of the base of the quadrangular pyramid may be parallel to a respective side of the light exit surface.

A vertex of the quadrangular pyramid may be overlapped with an intersection point of diagonal lines extending from opposite corners of the light exit surface when viewed from the light exit surface.

According to another aspect of the present disclosure, there is provided an LED package including: a package substrate; an LED mounted on a top surface of the package substrate; and an LED lens including a recess disposed in a quadrangular bottom surface of the LED lens and configured to have the LED disposed therein and mounted on the package substrate such that the LED is disposed within the recess; wherein the LED lens includes: an internal surface of the recess, including lateral surfaces and top surfaces of the recess, forming a light incident surface; a top surface of the LED lens forming a light exit surface, having a size greater than a size of the bottom surface of the LED lens, and having a quadrangular shape; and lateral surfaces of the LED lens, disposed between the top surface of the LED lens and the bottom surface of the LED lens, forming a reflective surface and guiding light incident to the LED lens through the light incident surface to the light exit surface, wherein the top surfaces of the light incident surface form an inverted quadrangular pyramid.

A vertex of the quadrangular pyramid may be disposed vertically above a mounting area in which the LED is mounted when viewed from the light exit surface.

The vertex of the quadrangular pyramid may be overlapped with an intersection point of diagonal lines extending from opposite corners of the light exit surface when viewed from the light exit surface.

Each lateral surface of the recess may have a quadrangular shape, and the recess may have a size greater than a size of the LED.

According to another aspect of the present disclosure, there is provided an LED package including: a package substrate; an LED mounted on a top surface of the package substrate; supports mounted on the top surface of the package substrate; and an LED lens mounted to the supports and including a recess disposed in a quadrangular bottom surface of the LED lens and configured to have the LED disposed therein; wherein the LED lens includes: an internal surface of the recess, including lateral surfaces and top surfaces of the recess, forming a light incident surface; and a light exit module formed as a parallelepiped, including a top surface forming a light exit surface of the LED lens, having a size greater than a size of the bottom surface of the LED lens, and having a bottom surface contacting the supports, wherein the top surfaces of the light incident surface form an inverted quadrangular pyramid.

The LED lens may further include lateral surfaces of the LED lens, disposed between the light exit module of the LED lens and the bottom surface of the LED lens, forming a reflective surface and guiding light incident to the LED lens through the light incident surface to the light exit surface; and corner reflective surfaces formed as curved surfaces disposed at corner portions of the LED lens between adjacent lateral surfaces of the LED lens.

The LED lens may be mounted to the supports such that the supports contact a bottom surface of the light exit module at locations proximate to the corner reflective surfaces.

The supports may be coupled to the lower portion of the light exit module using heat or an adhesive.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
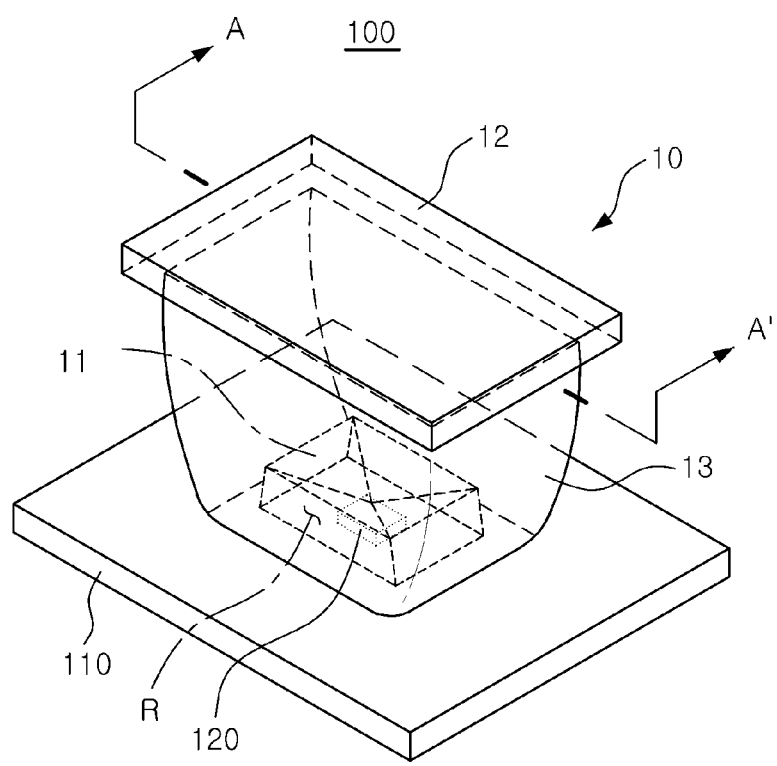
FIG. 1 is a schematic perspective view illustrating a light emitting diode (LED) package according to an embodiment of the present disclosure.

Exemplary embodiments of the present inventive concepts will now be described in detail with reference to the accompanying drawings.

The inventive concepts may, however, be embodied in many different forms and should not be construed as limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2A:
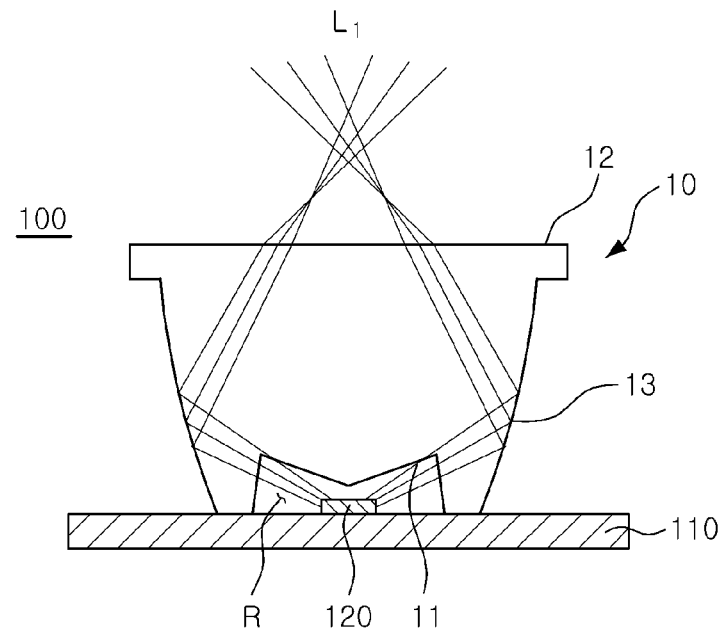
FIGS. 2A and 2B are schematic cross-sectional views illustrating optical paths of the LED package of FIG. 1.
Figure 2B:
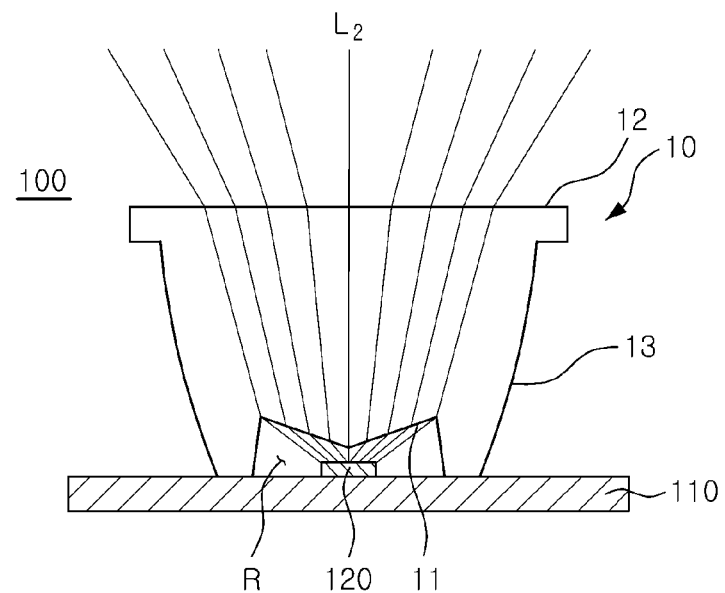

FIG. 1 is a schematic perspective view illustrating a light emitting diode (LED) package 100 according to an embodiment of the present disclosure. FIGS. 2A and 2B are schematic cross-sectional views illustrating optical paths of the LED package of FIG. 1. With reference to FIG. 1, an LED package 100 includes a package substrate 110, an LED 120 mounted on the package substrate 110 and an LED lens 10 mounted on the package substrate 110.

The LED package 100 according to the present embodiment of the disclosure is used as and/or forms part of a camera flash by way of example. However, the present disclosure is not limited thereto. The LED package 100 may be applied to various types of illumination devices.

The LED lens 10 may be formed of plastic or silicon. The LED lens 10 may include a recess R formed in a bottom surface thereof (e.g., a bottom surface that is in contact with substrate 110). The LED lens 10 may further include a light incident surface 11 defined by an internal surface of the recess R, a light exit surface 12 having a quadrangular shape, and a reflective surface 13 guiding light incident through the light incident surface 11 to the light exit surface 12.

The recess R may be formed in a quadrangular bottom surface of the LED lens 10 such as a bottom surface that is in contact with the substrate 110. The recess R may be formed in a position corresponding to the LED 120, and configured to have the LED 120 mounted therein. As such, a space in the LED lens 10 defined by the recess R has the LED 120 received therein when the LED 120 and the LED lens 10 are disposed on the substrate 110. Specifically, the recess R may have a quadrangular shape when viewed from the light exit surface 12, and may have dimensions and height sufficient to receive the LED 120 therein.

The internal surface of the recess R is defined as the light incident surface 11. The light incident surface 11 includes lateral surfaces and top surfaces of the recess R, and corresponds to a surface of the LED lens 10 through which light emitted from the LED 120 initially arrives or enters into the LED lens 10.

The lateral surfaces of the light incident surface 11 may include four lateral surfaces corresponding to the lateral surfaces of the quadrangular recess R formed in the LED lens 10.

Figure 3:
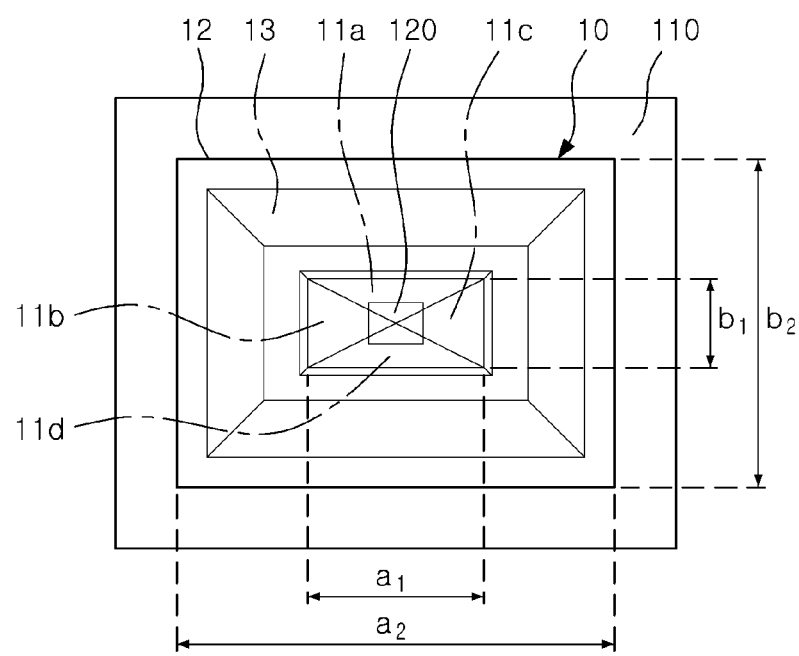
FIG. 3 is a plan view of the LED package of FIG. 1 when viewed from a light exit surface of the LED package.

The top surfaces of the light incident surface 11 may form an inverted quadrangular pyramid. Here, four triangular surfaces of the quadrangular pyramid are formed as isosceles triangles. As shown in FIG. 3, among the isosceles triangles, a first pair of opposing isosceles triangles 11a-11d may have the same shape as each other. A second pair of opposing isosceles triangles 11b-11c may have the same shape as each other. The base of the quadrangular pyramid may have a rectangular shape. Here, a ratio of a length of a side of the rectangular base of the quadrangular pyramid to a length of an adjacent side thereof may be 4:3, 3:2, or 16:9, which corresponds to an imaging area of a camera. That is, a ratio of lengths a1:b1, as shown in FIG. 3, may be 4:3, 3:2 or 16:9.

In some examples, the four lateral surfaces of the quadrangular pyramid may be formed as four isosceles triangles having the same shape, and the base of the quadrangular pyramid may have a square shape.

When viewed from the light exit surface 12, a vertex of the quadrangular pyramid may not be outside of a mounting area in which the LED 120 is mounted. In particular, the vertex may be disposed above the mounting area in which the LED 120 is mounted, such that the LED 120 is disposed below the vertex of the pyramid. When the LED 120 is disposed below the vertex of the quadrangular pyramid, the light emitted from the LED 120 may be prevented from being unevenly irradiated on the imaging area due to light emitted from the LED 120 being focused on a single lateral surface of the quadrangular pyramid. As such, the light emitted from the LED 120 may be radiated substantially evenly on the imaging area due to light emitted from the LED 120 being focused on all four lateral surface of the quadrangular pyramid.

The light exit surface 12 is defined by a top surface of the LED lens 10. The light exit surface 12 has a size greater than that of the bottom surface thereof, and has a quadrangular shape. The light exit surface 12 may be disposed to be opposite to the bottom surface of the LED lens 10. The light exit surface 12 may be formed as a planar surface or as a convex or concave surface. Specifically, the light exit surface 12 may have a rectangular shape or a square shape. In the case in which the light exit surface 12 is formed as a rectangle, the sides thereof may have lengths having the same ratio as the ratio of the lengths of the sides at the base of the quadrangular pyramid formed by the top surfaces of the recess R. That is, as shown in FIG. 3, the ratios a2:b2 and a1:b1 may be the same.

In the case in which the light exit surface 12 and the base of the quadrangular pyramid are formed as rectangles or squares having sides with the same length ratios, and in which sides of the light exit surface 12 and sides of the base of the quadrangular pyramid are formed to be parallel to each other when viewed from the light exit surface 12, the light exit surface 12 and the light incident surface 11 are arranged as shown in FIG. 3.

Specifically, when viewed from the light exit surface 12, the vertex of the quadrangular pyramid of the light incident surface 11 is overlapped or aligned with an intersection point of diagonal lines extending from opposite corners of the light exit surface 12. In such a situation, the light incident surface 11 and the light exit surface 12 have the same quadrangular shape, thereby allowing light to be further uniformly irradiated upon the imaging area.

The reflective surface 13 is defined by outer lateral surfaces of the LED lens 10 between the top surface of the LED lens 10 and the bottom surface thereof. The reflective surface 13 guides light incident to the LED lens 10 through the light incident surface 11 to the light exit surface 12.

Specifically, the reflective surface 13 is formed by connecting edges of the top surface to edges of the bottom surface of the LED lens 10. For example, as shown in FIG. 1, the reflective surface 13 may include four lateral surfaces connecting the rectangular top surface to the rectangular bottom surface of the LED lens 10.

The reflective surface 13 may be formed as a curved surface, such that incident light is emitted through the light exit surface 12 through total internal reflection without the loss of light. In this manner, the light from the LED 120 may be directed toward the light exit surface 12 through total internal reflection without the loss of light, and thus, it may be irradiated in a range corresponding to the imaging area having the quadrangular shape.

With reference to FIG. 2A, of the light emitted from the LED 120, light L1 traveling toward the lateral surfaces of the LED lens (rather than traveling directly toward the light exit surface 12) is incident through the light incident surface 11. The light L1 is then reflected by the reflective surface 13, and the reflected light is emitted through the light exit surface 12.

Here, the reflective surface 13 may be curved to allow the light incident through the light incident surface 11 to be focused on the front of the light exit surface 12. That is, the reflective surface 13 is formed as a curved surface to allow the light incident through the light incident surface 11 to be focused on the front of the light exit surface 12, and then intersected and distributed, thereby providing light focused on the imaging area to be irradiated.

The light L1 traveling toward the lateral surfaces 13 of the LED lens 10 rather than traveling directly toward the light exit surface 12, of the light emitted from the LED 120, is reflected by the reflective surface 13, and thus is directed toward the light exit surface 12. In order to allow the light L1 traveling toward the lateral surfaces to be totally internally reflected and directed toward the light exit surface 12, a reflective surface formed as a moderately curved surface can be used.

In the case in which a reflective surface 13 is formed as a moderately curved surface, the size of an LED lens 10 may be increased, and thus, an area occupied by the LED lens 10 may be enlarged. This may hinder the miniaturization of digital cameras and cameras for mobile communications terminals in which many components are mounted in a relatively narrow area. In the case of the LED lens 10 according to the embodiment of the present disclosure, since light emitted therefrom is intersected at the front of the light exit surface 12, the reflective surface 13 of the LED lens 10 may be formed as a relatively steep curved surface as compared to other LED lenses. Therefore, similar effect and performance may be achieved by the LED lens 10 as compared to other LED lenses, while the LED lens 10 may have a smaller size than the other LED lenses.

In addition, as shown in FIG. 2B, light L2 passing through the quadrangular pyramid of the light incident surface 11, of the light emitted from the LED 120, is emitted to have a rectangular light distribution pattern corresponding to the quadrangular pyramid shape of the light incident surface 11. The lateral surfaces of the quadrangular pyramid may be formed as planar surfaces, thereby allowing the light to be further uniformly distributed as compared with the case in which the lateral surfaces of the quadrangular pyramid are formed as curved surfaces.

Figure 5A:
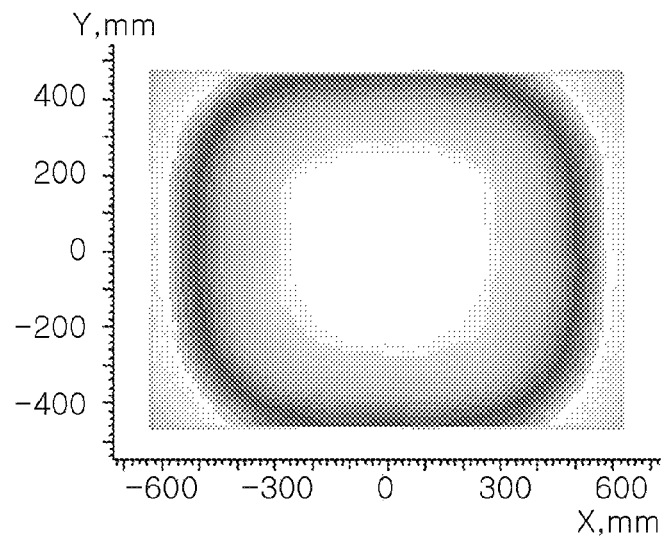
FIGS. 5A and 5B are views comparing a light emission profile of an LED lens of FIG. 1 with a light emission profile of an LED lens according to the related art.
Figure 5B:
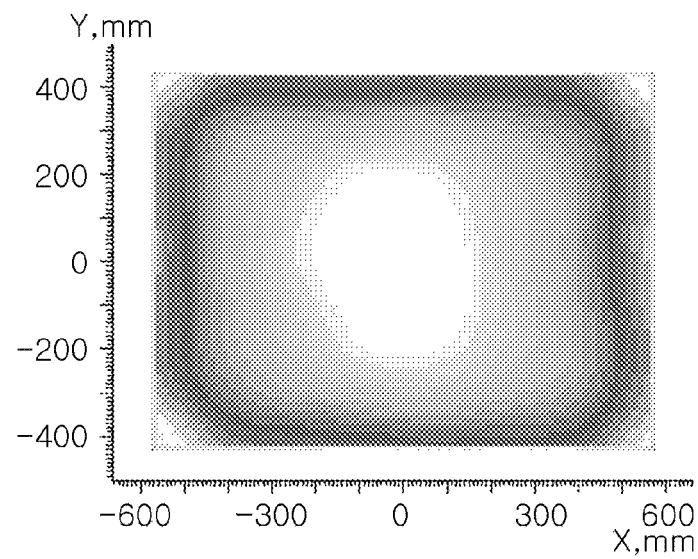

Therefore, the LED package 100 according to the embodiment of the present disclosure may have a light emission profile (see FIG. 5B) having a rectangular light distribution pattern, as compared with a light emission profile (see FIG. 5A) of the related art LED package having a circular light distribution pattern.

Figure 4:
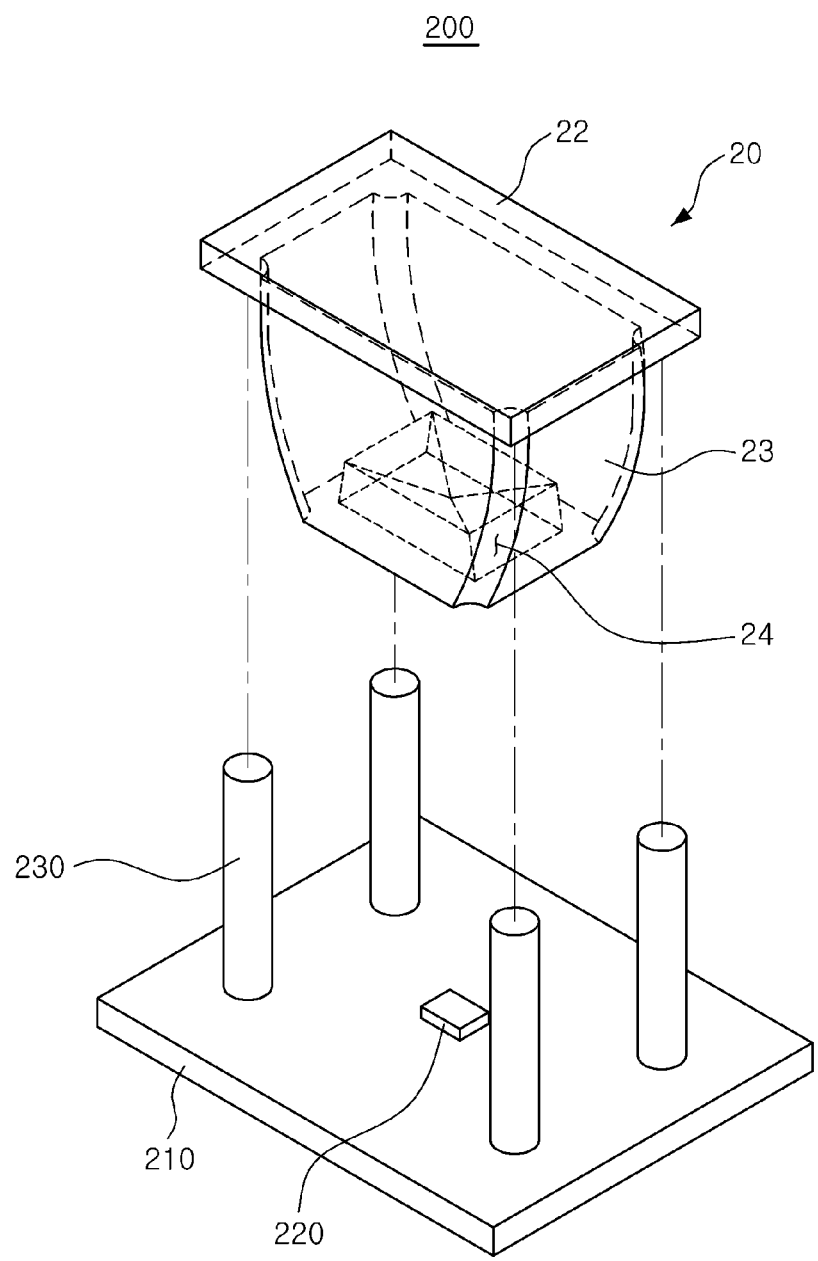
FIG. 4 is a schematic exploded perspective view illustrating an LED package according to another embodiment of the present disclosure.

Another embodiment of the present disclosure will be described below. FIG. 4 is a schematic exploded perspective view of an LED package 200 according to another embodiment of the present disclosure.

In an LED package 200 according to another embodiment of the present disclosure, supports 230 for supporting an LED lens 20 may be additionally formed on a package substrate 210. The supports 230 may be disposed to protrude from the package substrate 210, and one end of each support is coupled to a lower portion of a light exit module including a light exit surface 22. The light exit module shown in FIG. 4 is a parallelepiped having rectangular surfaces and disposed in an upper portion of lens 20. When the supports 230 are coupled to the lower portion of the module including the light exit surface 22, they are coupled using heat or an adhesive to corner portions of the lower portion (or surface) of the light exit module. The supports 230 are coupled to portions of lower surface of the light exit module on which the lens 20 is not formed. For example, as shown in FIG. 4, corner portions of the lower portion of the lens 20 may be removed in order to create space for the supports 230 to attach to the light exit module. The lower portion of the lens 20 may thus have cross-sections, taken along planes parallel to the light exit surface 22, that are shaped as rectangles having corners removed (e.g., rectangles from which quarter-circle portions have been removed). As a result of removing corner portions of the lens 20, the corners of the lens 20 may have reduced reflectivity as compared with other reflective surfaces 23. Therefore, corner reflective surfaces 24, formed as curved surfaces between adjacent lateral surfaces of the LED lens, may additionally be provided on the corner portions of the lens 20, thereby preventing a reduction in reflectivity at the corner portions.

As set forth above, in an LED lens and an LED package using the same according to embodiments of the disclosure, an orientation angle and an angle of view of light emitted therefrom can be improved.

While the present disclosure has been shown and described in connection with illustrative embodiments, it will be apparent to those skilled in the art that modifications and variations can be made without departing from the spirit and scope of the disclosure as defined by the appended claims.

What is claimed is:

1. A light emitting diode (LED) lens comprising:
a recess disposed in a quadrangular bottom surface of the LED lens and configured to have a light source disposed therein,
wherein an internal surface of the recess, including lateral surfaces and top surfaces of the recess, is a light incident surface;
a top surface of the LED lens forming a light exit surface, having a size greater than a size of the bottom surface of the LED lens, and having a quadrangular shape; and
lateral surfaces of the LED lens, disposed between the top surface of the LED lens and the bottom surface of the LED lens, forming a reflective surface, and guiding light incident to the LED lens through the light incident surface to the light exit surface,
wherein the top surfaces of the light incident surface form an inverted quadrangular pyramid.

2. The LED lens of claim 1, wherein the quadrangular pyramid includes four lateral surfaces that are isosceles triangles.

3. The LED lens of claim 2, wherein lateral surfaces on opposing sides of the quadrangular pyramid are isosceles triangles having the same shape.

4. The LED lens of claim 2, wherein the four lateral surfaces of the quadrangular pyramid are isosceles triangles having the same shape.

5. The LED lens of claim 3, wherein a base of the quadrangular pyramid is a rectangle, and
a ratio of a length of one side of the rectangle to a length of another side adjacent to the one side is 4:3, 3:2, or 16:9.

6. The LED lens of claim 1, wherein the light exit surface is a planar surface.

7. The LED lens of claim 1, wherein the reflective surface is a curved surface allowing light incident through the light incident surface to be reflected on the reflective surface and focused on the light exit surface.

8. The LED lens of claim 7, wherein the reflective surface reflects the light incident through the light incident surface so as to be totally internally reflected.

9. The LED lens of claim 1, wherein a base of the quadrangular pyramid is a rectangle, the rectangle having a same ratio between lengths of adjacent sides of the rectangle as a ratio between lengths of adjacent sides of the light exit surface.

10. The LED lens of claim 9, wherein each side of the base of the quadrangular pyramid is parallel to a respective side of the light exit surface.

11. The LED lens of claim 1, wherein a vertex of the quadrangular pyramid is overlapped with an intersection point of diagonal lines extending from opposite corners of the light exit surface when viewed from the light exit surface.

12. A light emitting diode (LED) package comprising:
a package substrate;
an LED mounted on a top surface of the package substrate; and
an LED lens including a recess disposed in a quadrangular bottom surface of the LED lens and configured to have the LED disposed therein and mounted on the package substrate such that the LED is disposed within the recess;
wherein the LED lens includes:
an internal surface of the recess, including lateral surfaces and top surfaces of the recess, forming a light incident surface;
a top surface of the LED lens forming a light exit surface, having a size greater than a size of the bottom surface of the LED lens, and having a quadrangular shape; and
lateral surfaces of the LED lens, disposed between the top surface of the LED lens and the bottom surface of the LED lens, forming a reflective surface and guiding light incident to the LED lens through the light incident surface to the light exit surface,
wherein the top surfaces of the light incident surface form an inverted quadrangular pyramid.

13. The LED package of claim 12, wherein a vertex of the quadrangular pyramid is disposed vertically above mounting area in which the LED is mounted when viewed from the light exit surface.

14. The LED package of claim 13, wherein the vertex of the quadrangular pyramid is overlapped with an intersection point of diagonal lines extending from opposite corners of the light exit surface when viewed from the light exit surface.

15. The LED package of claim 12, wherein each lateral surface of the recess has a quadrangular shape, and the recess has a size greater than a size of the LED.

16. A light emitting diode (LED) package comprising:
a package substrate;
an LED mounted on a top surface of the package substrate;
supports mounted on the top surface of the package substrate; and
an LED lens mounted to the supports and including a recess disposed in a quadrangular bottom surface of the LED lens and configured to have the LED disposed therein;
wherein the LED lens includes:
an internal surface of the recess, including lateral surfaces and top surfaces of the recess, forming a light incident surface; and
a light exit module formed as a parallelepiped, including a top surface forming a light exit surface of the LED lens, having a size greater than a size of the bottom surface of the LED lens, and having a bottom surface contacting the supports,
wherein the top surfaces of the light incident surface form an inverted quadrangular pyramid.

17. The LED package of claim 16, wherein the LED lens further comprises:
lateral surfaces of the LED lens, disposed between the light exit module of the LED lens and the bottom surface of the LED lens, forming a reflective surface and guiding light incident to the LED lens through the light incident surface to the light exit surface; and
corner reflective surfaces formed as curved surfaces disposed at corner portions of the LED lens between adjacent lateral surfaces of the LED lens.

18. The LED package of claim 16, wherein the LED lens is mounted to the supports such that the supports contact a bottom surface of the light exit module at locations proximate to the corner reflective surfaces.

19. The LED package of claim 16, wherein the supports are coupled to the lower portion of the light exit module using heat or an adhesive.

* * * * *